United States Patent [19]

von Sichart

[11] Patent Number: 4,682,047
[45] Date of Patent: Jul. 21, 1987

[54] COMPLEMENTARY METAL-OXIDE-SEMICONDUCTOR INPUT CIRCUIT

[75] Inventor: Frithjof von Sichart, Munich, Fed. Rep. of Germany

[73] Assignee: Siemens Aktiengesellschaft, Berlin and Munich, Fed. Rep. of Germany

[21] Appl. No.: 898,144

[22] Filed: Aug. 18, 1986

[30] Foreign Application Priority Data

Aug. 29, 1985 [DE] Fed. Rep. of Germany ....... 3530917

[51] Int. Cl.$^4$ .................. H03K 17/08; H03K 19/003; H03K 19/094; H03K 17/687
[52] U.S. Cl. ............................... 307/200 B; 307/443; 307/473; 307/451; 307/360; 307/585
[58] Field of Search ............ 307/200 B, 451, 573–577, 307/579, 584, 585, 270, 255, 304, 473, 263, 360, 592, 593, 594, 443; 361/90–92

[56] References Cited

U.S. PATENT DOCUMENTS

| | | | |
|---|---|---|---|
| 4,066,918 | 1/1978 | Heuner et al. ...................... | 307/304 |
| 4,264,941 | 4/1981 | London ............................ | 307/304 X |
| 4,302,690 | 11/1981 | Gollinger et al. ............... | 307/473 X |
| 4,438,352 | 3/1984 | Mardkha ........................ | 307/451 X |
| 4,498,021 | 2/1985 | Uya ................................ | 307/263 X |
| 4,527,077 | 7/1985 | Higuchi et al. ............. | 307/200 B X |
| 4,594,519 | 6/1986 | Ohtani et al. .................. | 307/451 X |
| 4,628,218 | 12/1986 | Nakaizumi ......................... | 307/451 |

FOREIGN PATENT DOCUMENTS 0111525 2/1983 Japan .

Primary Examiner—Stanley D. Miller
Assistant Examiner—David R. Bertelson
Attorney, Agent, or Firm—Hill, Van Santen, Steadman & Simpson

[57] ABSTRACT

A pull-up or pull-down resistor is connected between the CMOS circuit input and an operating potential source for defining the input potential of the unconnected circuit input and is formed by a MOS transistor circuit which is controlled from the circuit input and which is conductive between the threshold voltage of the MOS transistors of the one channel type and the threshold voltage of the MOS transistors of the other channel type. This MOS transistor circuit comprises two series-connected transistors which are controlled by two oppositely greatly asymmetrical CMOS inverters which have their inputs connected to the circuit input.

4 Claims, 5 Drawing Figures

COMPLEMENTARY METAL-OXIDE-SEMICONDUCTOR INPUT CIRCUIT

BACKGROUND OF THE INVENTION

In the utilization of complementary metal-oxide-semiconductor (CMOS) circuits it must be taken into consideration that the input potential of unconnected CMOS circuit inputs, or CMOS circuit inputs connected to tri-state circuits situated in the quiescent condition, is undefined, so that the CMOS transistors proceed into undefined operating conditions and can generate incorrect output signals. In order to prevent this situation, momentarily unused CMOS circuit inputs are to be connected to the one or to the other operating potential source of the CMOS circuit which can occur with the assistance of a correspondingly-dimensioned ohmic (pull-up or pull-down) resistor (McMOS Handbook, Motorola Inc., October, 1973, Chapter 6.D4, Page 6.15). Also simultaneously countered therewith is the further problem connected with the undefined input potential of CMOS circuits that, when such an input potential arrives in a critical region between the threshold voltage of the p-channel transistors and the threshold voltage of the n-channel transistors, both p-channel transistors and n-channel transistors can be highly conductive and can then be traversed by higher currents which causes destruction of the transistors after a short time.

Such ohmic pull-up or pull-down resistors can be provided in the form of external components with which the appertaining CMOS circuit inputs are connected. For reasons of space, however, such an external wiring is frequently not possible. Due to the ohmic connection of the input nodes to a fixed potential source which is then constantly established, on the other hand, an inherently possible integration of ohmic pull-up or pull-down resistors into the input structures of CMOS circuits no longer permits a measurement, in particular, the measurement of the input inverse currents, which is extremely important for the testing and technological evaluation of CMOS circuits.

SUMMARY OF THE INVENTION

The object of the present invention, therefore, is to provide a CMOS input circuit which, on the one hand, is integratable but which, on the other hand, also enables measurement of input inverse currents.

According to the invention, a CMOS input circuit comprises a pull-up or pull-down resistor lying between the CMOS circuit input and an operating potential source, the resistor being for the definition of the input potential of the unconnected circuit input. This CMOS input circuit, according to the present invention, is particularly characterized in that the pull-up or pull-down resistor is formed by a metal-oxide-semiconductor (MOS) transistor circuit which is only conductive in a central region lying between two thresholds and which forms a switched resistor controlled from the circuit input, the one threshold of the MOS transistor circuit lying close to the threshold voltage of the MOS transistors of the one channel type and its other threshold lying close to the voltage threshold of the MOS transistors of the other channel type.

The invention provides the advantage of both being able to integrate the input circuit into the following, actual CMOS circuit as well as being able to subject the overall CMOS circuit to a measurement of the input reverse current, lying on the order of magnitude of less than 1 $\mu$A, and, therefore, being able to therefore obtain a criterion for the outage susceptibility of the CMOS circuit.

It should be pointed out here that it is known from U.S. Pat. No. 4,498,021, fully incorporated herein by this reference, to provide a booster circuit in a CMOS integrated circuit for crispening the signal edges on a capacitance-burdened signal line extending between a digital signal transmitting circuit and a digital signal receiving circuit, whereby an MOS transistor circuit lying between the signal line and the operating potential source, formed with two MOS transistors of the same channel type and controlled from the signal line via three CMOS inverters and one RS flip-flop is conductive only in the time interval between two points in time at which a signal edge traverses two thresholds lying in the proximity of half of the operating potential in order to feed an edge-crispening current pulse into the signal line in this time interval. This known booster circuit having thresholds lying in the proximity of half the operating potential and, therefore, not exactly close to the threshold voltages of the MOS transistors of the two channel types is provided within a CMOS integrated circuit between a transmitting circuit and a receiving circuit and representing neither a CMOS input circuit comprising a pull-up or pull-down resistor lying between the CMOS circuit and an operating potential source for defining the input potential of the unconnected circuit input, nor does it make it possible to be able to subject the overall CMOS circuit to a measurement of the input reverse current such as is, however, precisely enabled by the present invention. A transistor circuit which is likewise only briefly conductive during the appearance of a positive or negative signal edge (1-0 or 0-1 transition) which comprises two MOS transistors of the same type or opposite channel types is also known from the Japanese published application No. 58-111525; this known circuit arrangement likewise leaves the problem area of the appearance of inadmissible potentials at the unconnected input of a CMOS circuit and the need to measure input reverse currents of CMOS circuits unaffected.

Returning now to the present invention, the pull-up or pull-down resistor, according to a further feature of the invention, can be formed by two series-connected CMOS transistors which are controlled by two oppositely-asymmetrical CMOS inverters having their inputs connected to the circuit inputs; alternatively thereto, the pull-up or pull-down resistor can also be formed by two series-connected MOS transistors of the same channel type which are controlled either directly or via an inverter by two oppositely-asymmetrical CMOS inverters which have their inputs connected to the input circuit.

In both instances, the two CMOS inverters are advantageously constructed oppositely asymmetrically such that the ratio of resistance of the two conductive transistors corresponding to the ratio of the quotient W/L of the respective channel width W and channel length L of the one or the other transistor is great in comparison to 1 in the case the one CMOS inverter is small in comparison to the 1 in the case of the other CMOS inverter.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
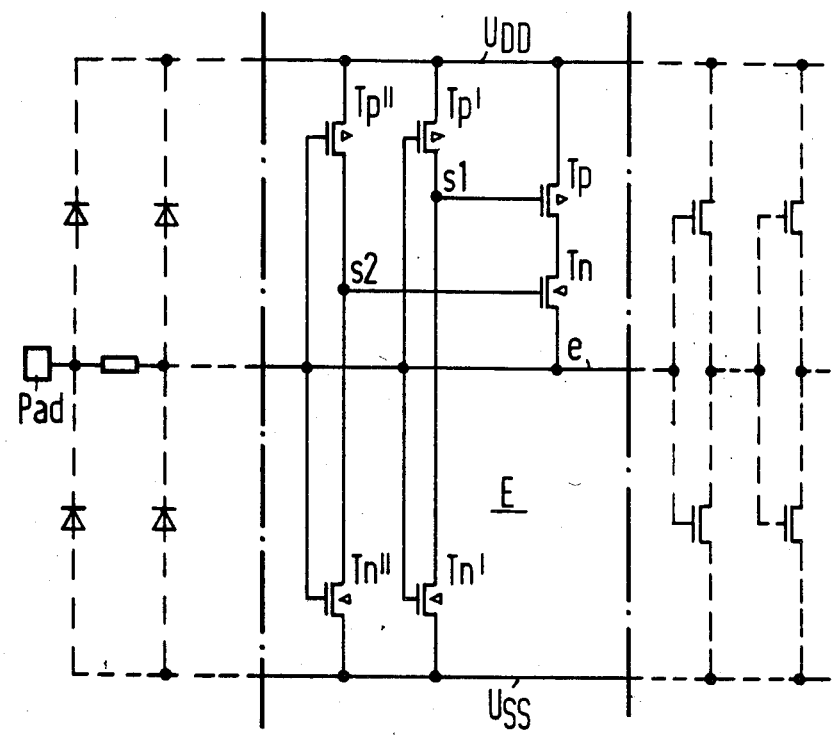
FIG. 1 is a schematic circuit diagram of an exemplary embodiment of a CMOS input circuit constructed in accordance with the present invention.

Referring to FIG. 1, an exemplary embodiment of a CMOS input circuit constructed in accordance with the present invention is illustrated as comprising an input circuit E which includes a switched pull-up resistor connecting the CMOS circuit input e to the operating potential line $U_{DD}$, the pull-up resistor being formed by the series connection of a p-channel transistor Tp and an n-channel transistor Tn. The two CMOS transistors Tp and Tn are thereby controlled by two CMOS inverters Tp', Tn' and Tp", Tn" which have their inputs connected to the circuit input e.

It is assumed that the actual CMOS circuit follows the CMOS input circuit E. Indicated in this regard in FIG. 1 is that an input amplifier formed with two CMOS inverters can lie at the beginning of the CMOS circuit. On the other hand, let it be assumed that the CMOS input circuit E be preceded by a standard (likewise integrated) overvoltage protection circuit, as is likewise indicated in FIG. 1. The externally accessible terminal pad on the edge zone of the integrated circuit is referenced Pad in FIG. 1, the input reverse current flowing from the operating potential line $U_{DD}$ or, respectively, flowing to the operating potential line $U_{SS}$ to be measured at this Pad given a test of the integrated circuit.

In the CMOS input circuit E, both CMOS inverters Tp', Tn' and Tp", Tn" are constructed asymmetrically such that the ratio of the resistance of the two conductive transistors corresponding to the ratio of the quotient W/L of the respective channel width W and channel length L of the one or the other transistor is great in comparison to 1 in the case of the one CMOS inverter and is small in comparison to 1 in the case of the other CMOS inverter. For example, let the p-channel transistor Tp' of the one CMOS inverter and n-channel transistor Tn" of the other CMOS inverter exhibit a channel width/length ratio W/L of 0.2, whereas the n-channel transistor Tn' of the one CMOS inverter and the p-channel transistor Tp" of the other CMOS inverter exhibits, for example, a channel width/length ratio W/L of 5 or, as well, a ratio of 20. The two CMOS transistors Tp and Tn forming the actual pull-up resistor can then respectively comprise a channel width/length ratio W/L of 1.

Figure 3:
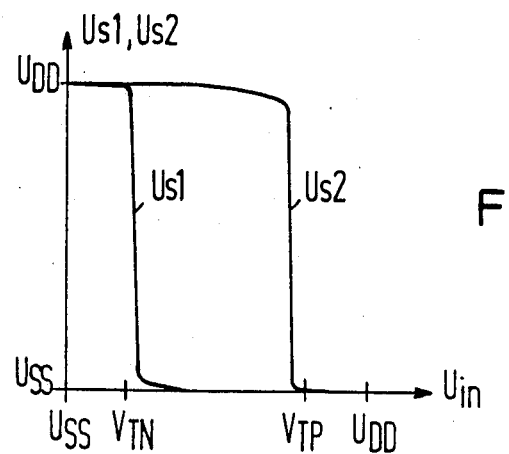
FIG. 3 is a graphic illustration of signal curves in such CMOS input circuits.

The control signals Us1 and Us2 for the two series transistors Tp and Tn forming the switchable pull-up resistor which appear at the two outputs s1 and s2 of the two asymmetrical CMOS inverters Tp', Tn' and Tp", Tn" then have the fundamental dependency on an input potential $U_{in}$ appearing at the terminal Pad and, therefore, at the circuit input e, this dependency being illustrated in FIG. 3.

When the potential $U_{SS}$ appears at the terminal Pad and, therefore, at the circuit input e or, stated in more general terms, when a potential remaining below the threshold voltage $V_{TN}$ of the n-channel transistors of the CMOS circuit appears at the input e, then the p-channel transistors Tp' and Tp" of both CMOS inverters Tp', Tn' and Tp", Tn" are conductive so that the potential $U_{DD}$ appears at both inverter outputs s1 and s2, the p-channel transistor Tp in the series-connection of two transistors Tp and Tn being non-conductive due to the potential $U_{DD}$ and the n-channel transistor Tn becoming conductive on the basis of the potential $U_{DD}$. The overall transistor series circuit Tp, Tn therefore has a negligibly small conductance.

When the threshold voltage $V_{TN}$ of the n-channel transistors of the CMOS circuit is exceeded (or shortly thereafter at any rate), the threshold of the CMOS inverter Tp', Tn' is reached, so that its heretofore non-conductive n-channel transistor Tn' becomes conductive. Given the above-specified W/L ratios, its resistance will lie at 10 kohm or, respectively, at 400 ohm, in contrast whereto, the p-channel transistor Tp' is now in a high-resistance state. Consequently, the inverter output s1 assumes the potential $U_{SS}$ on the basis of which the p-channel transistor Tp in the series connection of the two transistors Tp and Tn becomes conductive whereas the n-channel transistor Tn continues to be conductive. The series circuit Tp, Tn therefore acts as a pull-up resistor by way of which the circuit input e and, therefore, the terminal Pad is connected to the operating potential source $U_{DD}$. When the input potential $U_{in}$ continues to rise, then, together with the gate-source voltage of the n-channel transistor Tn, the conductivity thereof also decreases and, therefore, so does the conductivity of the series circuit Tp, Tn, the curve thereof being illustrated in FIG. 4 dependent on the input potential $U_{in}$.

Shortly before, finally, the input potential reaches the threshold voltage $V_{TP}$ of the p-channel transistors of the CMOS circuit, the threshold of the CMOS inverter Tp", Tn" is exceeded, wherewith its heretofore conductive p-channel transistor Tp" is inhibited. By way of its n-channel transistor Tn" which has already been conductive since the threshold voltage $V_{TN}$ was exceeded, but which is extremely highly resistant, given the W/L ratios mentioned above, its resistance can lie at 100 kohm, the inverter output s2 consequently assumes the potential $U_{SS}$ on the basis of which the n-channel transistor Tn of the series circuit of the two transistors Tp and Tn becomes non-conductive. The series circuit Tp, Tn therefore no longer continues to act as a pull-up resistor.

As may be seen, the transistor series circuit Tp, Tn therefore acts as a pull-up resistor only given input potentials lying between the threshold voltages $V_{TN}$ and $V_{TP}$ of a CMOS circuit and, therefore, prevents the appearance of inadmissible potentials at the unconnected input, whereas it remain ineffective given potentials lying therebelow or thereabove and, therefore, also given the operating potentials $U_{SS}$ and $U_{DD}$ which usually simultaneously serve as control potentials.

Figure 2:
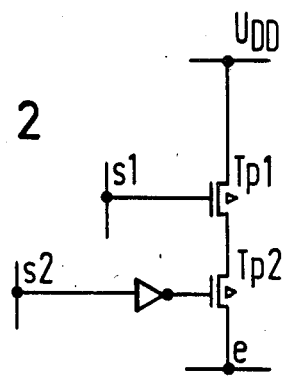
FIG. 2 is a schematic circuit diagram of an alternative of the CMOS input circuit.
Figure 4:
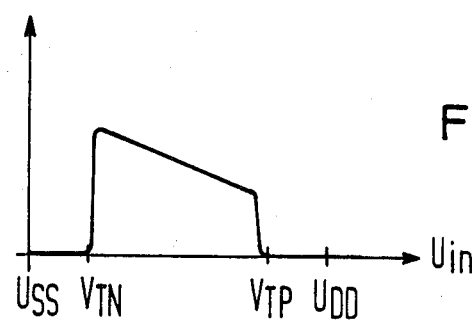
FIGS. 4 and 5 illustrate the conductivity behavior of the switched pull-up or pull-down resistor in the CMOS input circuit of FIG. 1 and FIG. 2, respectively.
Figure 5:
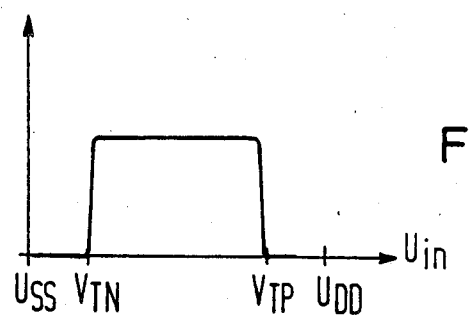

In a departure from the exemplary embodiment set forth above with reference to FIGS. 1, 3 and 4, the pull-up resistor can also be formed with two MOS transistors of the same channel type instead of with two CMOS transistors Tp, Tn as illustrated in FIG. 1, being formed, for example, with two p-channel transistors Tp1, Tp2 as illustrated in FIG. 2. The one series transistor, the transistor Tp2 in this example, is thereby connected to the appertaining inverter output s2 via an inverter, whereas the other series transistor Tp1 is driven directly from the CMOS inverter output s1, as in the exemplary embodiment of FIG. 1. Since, given such a realization of the switched pull-up resistor comprising two p-channel transistors Tp1, Tp2, the gate-source voltage of the p-channel transistor Tp2 does not change given conductive transistors Tp1 and Tp2, the conductivity thereof and, therefore, the conductivity of the series circuit Tp1, Tp2 overall remains at the same level in the entire effective range of the series circuit, as illustrated in FIG. 9. Moreover, the above comments provided regarding the exemplary embodiment of FIG. 1 apply analogously for a CMOS input circuit in which the switched resistor is realized in the manner shown in FIG. 2 without this having to be presented again in great detail.

The exemplary embodiments of CMOS input circuits of the present invention, as set forth above, respectively provide a pull-up resistor lying between the CMOS circuit input and the potential source $U_{DD}$, the pull-up resistor being realized in accordance with the present invention. However, it is clear that CMOS input circuits comprising a pull-down resistor lying between the CMOS circuit input and the potential source $U_{SS}$ can also be realized in a corresponding manner without it being necessary to set forth the same in greater detail herein.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In a complementary metal-oxide-semiconductor circuit of the type which includes a circuit input, complementary metal-oxide-semiconductor transistors each having a threshold voltage, and an operating voltage source, the improvement of an input circuit comprising a switched resistor which is controlled from the input to define the potential at the input terminal when the same is not connected, said improvement comprising:

a metal-oxide-semiconductor transistor circuit including first and second serially connected transistors connected between the circuit input and the operating voltage source, said first transistor having a gate and a first threshold voltage near the threshold voltage of one of the channel types, said second transistor having a gate and a second threshold voltage near the threshold voltage of the other channel type, said first and second threshold voltages lying in a region between the threshold voltages of the complementary metal-oxide-semiconductor transistors; and control means connected between the input and said gates and responsive to the potential at the input to operate said first and second transistors to states of conductivity which cause a potential to be defined at the input.

2. The improved semiconductor circuit of claim 1, wherein:

said first and second transistors are complementary metal-oxide-semiconductor transistors; and said control means comprises two oppositely asymmetrical complementary metal-oxide-semiconductor inverters each including an input connected to the circuit input and an output connected to a respective gate.

3. The improved semiconductor circuit of claim 1, wherein:

said first and second transistors are of the same channel type; and said control means comprises two oppositely asymmetrical complementary metal-oxide-semiconductor inverters each including an input connected to the circuit input, and an output, an inverter connecting one of said outputs to one of said gates, and the other of said outputs connected to the other of said gates.

4. The improved semiconductor circuit of claim 2 or 3, wherein:

said two oppositely asymmetrically complementary metal-oxide semiconductor inverters each include two transistors having, respective channel width to channel length ratios such that the ratio of the resistance of the two conducting transistors is great with respect to 1 for one of the inverters and small with respect to one for the other inverter.

* * * * *